(12) United States Patent
Vodopivec et al.

(10) Patent No.: US 6,218,851 B1
(45) Date of Patent: Apr. 17, 2001

(54) METHOD AND APPARATUS FOR TESTING A PRINTED CIRCUIT

(75) Inventors: Jozef Vodopivec; Cesare Fumo, both of Gorizia (IT)

(73) Assignee: New System S.r.l., Gorizia (IT)

( * ) Notice: Subject to any disclaimer, the term of this patent is extended or adjusted under 35 U.S.C. 154(b) by 0 days.

(21) Appl. No.: 09/043,565

(22) PCT Filed: May 3, 1996

(86) PCT No.: PCT/IT96/00090

§ 371 Date: Aug. 7, 1998

§ 102(e) Date: Aug. 7, 1998

(87) PCT Pub. No.: WO97/11377

PCT Pub. Date: Mar. 27, 1997

(30) Foreign Application Priority Data

Sep. 22, 1995 (IT) .............................................. UD95A0181

(51) Int. Cl.[7] ................................................... G01R 31/02
(52) U.S. Cl. ............................................ 324/761; 324/754
(58) Field of Search ................................... 324/754, 755, 324/757, 758, 761, 765

(56) References Cited

U.S. PATENT DOCUMENTS

| | | | | |
|---|---|---|---|---|
| 4,841,241 | * | 6/1989 | Hilz et al. .............................. | 324/754 |
| 5,068,600 | * | 11/1991 | Hilz et al. .............................. | 324/755 |
| 5,818,246 | * | 10/1998 | Zhong ................................... | 324/754 |
| 6,124,722 | | 9/2000 | Vodopivec et al. ................... | 324/761 |

* cited by examiner

*Primary Examiner*—Glenn W. Brown
*Assistant Examiner*—Russell M. Kobert
(74) *Attorney, Agent, or Firm*—Wenderoth, Lind & Ponack, LLP

(57) ABSTRACT

The object of the invention is to provide a machine for the control of printed circuits, of the type comprising a board bearing (1) a plurality of conductive needles that are connectable on their reverse side to analysis means of the electric parameters between one and the other needle, characterized in that are used two needle boards, one opposite to the other (1, 1') and between them is positioned for the analysis the respective printed circuit card (2); and, one board is made movable respect to the other, the needles are axially movable.

11 Claims, 1 Drawing Sheet

METHOD AND APPARATUS FOR TESTING A PRINTED CIRCUIT

TECHNICAL FIELD

This invention has as object a machine for the opposite control of printed circuits.

The invention finds particular even if not exclusive application in the sector of the control of the printed circuit cards.

BACKGROUND ART

In prior art machines for the control of the printed circuits are known.

These machines generally consist of a board or bed bearing a plurality of electrically conductive needles, on which must be disposed the card with the printed circuit and by activating properly the electric conductivity among the different needles and by making the respective measurings it is possible to check whether the printed circuit has defects.

Obviously for such control it is necessary for the needles to contact the printed circuit in the proper position.

As the printed circuits are very different, it results necessary to apply over the needle base board, an adaptation board that comprises the same needles but displaced in a different way in conformity with the printed circuit to be controlled.

The drawback of this solution is the limitation of the machine and the possibility to control only the printed circuits that have at disposal corresponding adapters or adaptation boards.

Needing as many adaptation boards as are the cards with different printed circuits to be controlled.

Furthermore it is known that the layers of the circuits are not always coplanar, wherefore a suitable electric conduction for an effective contact is not always ensured.

EP,A,0 164 722 (Black) Dec. 18, 1985 discloses: an automatic test system for testing printed circuit boards (cards) in which:
In this document prior art is cited:
  use of a "bed of nails" (bed or plate or board of needles), in which each nail or needle is fixedly placed in said bed or plate or board.
  In this solution the "bed of nails" has the nail position absolutely fixed and corresponding to the specific pattern of the printed card to be tested.
  Drawback of this solution is the requirement of as many "beds of nails" as the different printed circuit cards to be tested. use of a universal grid matrix having a maximum possibility of positionally fixed needles (nails) and a computer program to activate only the required needles (nails) at a time. The programming being dependant on the pattern of the printed card to be tested.
  This solution has the drawback of continuously reprogramming the machine. Furthermore, because the contact nails or needles are bulky, it is impossible to cover all kinds of patterns.
  This problem is avoided rendering displaceable along the coordinate axis said contact needles or nails.
  Nevertheless this solution requires a very complicated and expensive construction of the testing machine and in this case the needles or nails cannot be placed closely one next to the other. Furthermore a continuous reprogramming is required to move one needle or nail in respect to the other.
  Finally, EP,A,0 164 722 discloses its claimed solution, in which there is a magazine for temporarily storing a plurality of probes (nails or needles) and a base receiver member positioned adjacent to the test head (bed or plate) on one side thereof and in a position to contact the base of each probe. The test head (bed or plate) is adapted to receive the probes and position the probes in a pattern matching test points on the printed circuit board. Means are provided for supporting the test head adjacent to the magazine and in a position to receive probes (nails or needles) from the magazine. Means are also provided for transferring selected ones of the probes from the magazine to the test head.

The probes (nails or needles) are for this purpose, movable axially from inside the said test head to the outside or vice versa and some of these further axially moved in order to allow contact with the printed circuit of the card to be tested.

This solution is extremely complex because of the mechanisms to move the probes (nails or needles) and the program to operate. Furthermore this solution does not allow a complete universal testing of all kinds of printed circuit cards because of the limitation of the pattern of the test head.

EP,A,0 468 153 (ATG ELECTRONIC) Jan. 29, 1992, discloses a system in which the respective contact needles are not fixed in position on the respective needle bearing board, but are movable both axially and from their position along the coordinate axis.

In this way it is possible to make the testing machine universal. Nevertheless, this solution is complex and requires a continuous reprogramming. Furthermore this solution is lengthy because the movable needles are obliged to move for a long way to reach the exact coordinates, and this has to be done continuously during the testing of each single card for the respective interested points to be tested in the circuit.

EP-A-0 547 251 discloses a method for testing a micro circuit, where a "wafer holder" and a "test head . . . incorporating a matrix of probes" is provided and wherein said wafer holder is movable on its (X-Y) plane whereas the test head is movable along the orthogonal (Z) direction.

This solution is able to test printed circuit cards because it is conceived for testing on one side only.

DISCLOSURE OF THE INVENTION

The purpose of the present invention is that to obviate the abovementioned drawbacks, and in particular to allow the making of a universal machine able to control the printed circuits, that is having a system of conductive detection needles that can be adapted to any type of circuit.

This and other purposes as claimed are obtained by means of a machine for the control of printed circuits, comprising a board bearing a plurality of conductive needles connectable on their reverse side to analysis means of electric parameters between one and the other needle: wherein
  two needle bearing boards are used, one opposing the other and between them is placed for the analysis the respective printed circuit card to be controlled, said printed circuit card being movably supported on its plane,
  characterized in that:
    each needle bearing board supports a plurality of conductive needles said needles being axially movable only in the respective needle bearing board;
    at least one of said needle bearing boards is movable on its plane, in order that the positioning of the needle concerned to put in contact with the point concerned of the printed circuit of the card to be tested, is obtained.

In this way it is obtained the immediate advantage of simplifying all the system by making universal the application of the machine on different printed circuits without needing adapters. In fact by this it is possible to activate a board needle in any leading end circuit position and to activate an opposite needle of the opposite board, which thanks to the movability of the same board will be able to reach any definite circuit end point to be tested independently from its position, place and shape.

In this way the universalization of the testing system for any card is ensured.

Advantageously the machine has also the characteristic that the detection needles are axially movable.

In this way, among a plurality of needles it is possible to make interact only some of them, centering more easily the desired positions of the printed circuit.

Further advantage derives from that with the axial movability of the needles it is possible to contact better the respective desired points of the circuit even when the card or the layer of the circuit is not perfectly on the same plane in all its points.

Advantageously the needles are made axially movable by electromagnetic means.

In this way the desired needle is operated in a simple and safe way.

These and other advantages will be shown by the following description of embodiment preferred solutions with the help of the included drawings whose details are not to be considered limitative but only given as an example.

Figure 1:
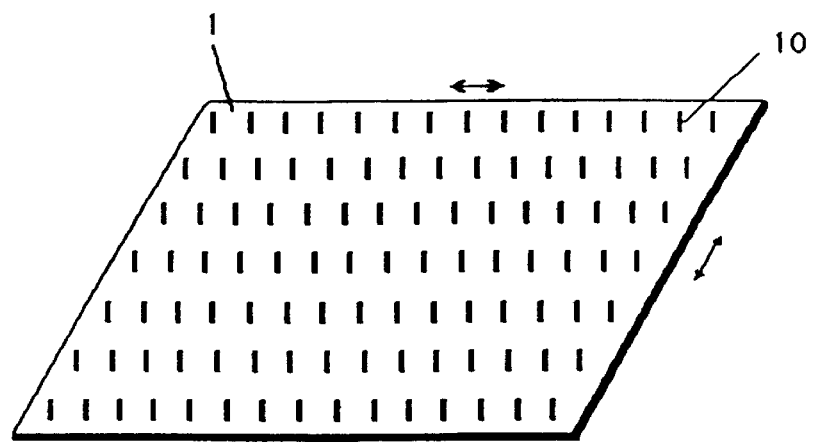
FIG. 1 is a perspective schematic view of a detection board (bed)
Figure 2:
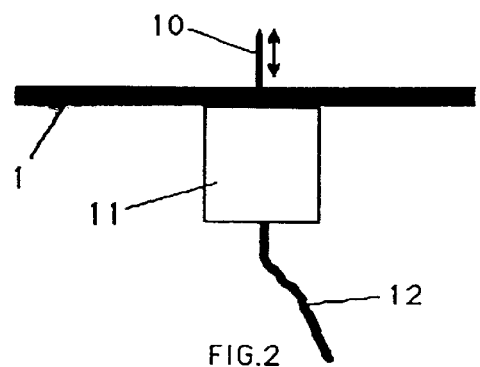
FIG. 2 is a cross-sectional schematic view of an axially movable detection needle.
Figure 3:
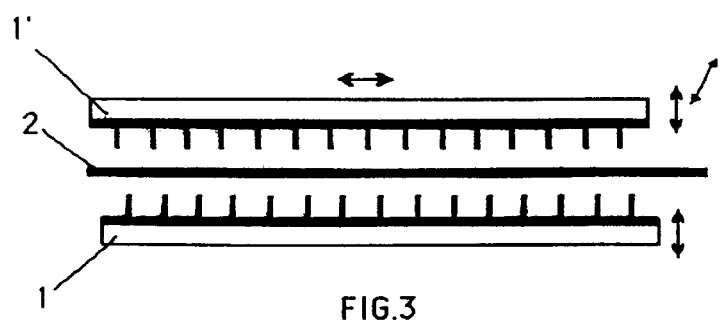
FIG. 3 is a cross-sectional view of the preferred embodiment with two opposite detection boards movable one respect to the other and with the card to -be controlled placed between them.

In particular in the figures the two detection testing boards are indicated with 1 and 1'.

Each board has a plurality of needles axially movable 10 by electromagnet 11.

Each needle is electrically connected to a known art electric parameters control system 12.

The opposite boards as mentioned are movable one respect to the other for the operative positioning.

The card positioned between these is indicated with 2.

The system provides a control by a net list "net-list" with relative positions of single points.

The connection test is carried out from point to point, so that for testing the connections of a net made of n points, are necessary n–1 tests between pairs of points selected in such a way to cover all the connections.

The test on short circuits among different nets, is made by selecting a point out of each pair of nets.

The maximum number for testing (testing) n nets in this way, is calculated with the following formula:

$$n*(n-1)/2.$$

This number can be reduced by selecting only alongside nets, that is the ones close to each other in a pre-determined distance.

The positions to be tested are subdivided in sectors corresponding to the number of needles in the movable board (bed), so that the point to be tested is reachable with the position and with one of the testing needles.

After the points to be tested are reached, it is necessary to check the connection or insulation.

To shorten the time used for the movements, it is possible to optimize the paths of the axes, by modifying the frequency of the single tests. The machine is made up of a frame on which are fixed two opposite boards and independently, movable respect to the two orthogonal axes.

On the boards are fixed the testing sounds (needles) directly operated by electromagnet in their axial movement.

At the beginning, the printed circuit is placed on a bearing frame that transports it between the two boards.

In this position the card remains fixed.

The boards are put close to the card and the test begins.

Each board is independently controlled and operated, so that the maximum stroke necessary is defined by the distance among the sounds.

In correct position, the electromagnet operates the sound on the surface to be contacted and thus by a pair of sounds simultaneously operated is controlled the functionality of the circuit among the two desired points, the respective continuity and eventual short circuits. The process proceeds by points in repetitive way as desired.

Advantageously also the card bearing may be moved respect to one or the other board.

In this way is obtained a wider universalization of use.

What is claimed is:

1. A method for testing a printed circuit, said method comprising:

placing the printed circuit between two needle bearing boards opposing each other, wherein each of the two needle bearing boards has a plurality of independently operable conductive needles;

moveably supporting the printed circuit;

positioning at least one of the two needle bearing boards along its plane in both its orthogonal axes with respect to the printed circuit to a position such that one needle of each of the plurality of independently operable conductive needles of each of the two needle bearing boards is in position to contact a test point on the printed circuit, said positioning of at least one of the two needle boards requiring a movement in each of the orthogonal axes of no greater than a distance between two of the plurality of independently operable needles on the at least one of the two needle bearing boards;

axially moving the one needle of each of the two needle bearing boards to contact respective test points on the printed circuit with an electromagnet even when the printed circuit is not on a same plane at all its points; and testing the test points of the printed circuit by using an analysis device to analyze electric parameters between the test points.

2. A method for testing a printed circuit as claimed in claim 1, further comprising repeating said positioning, said axially moving and said testing for a number of test points stored in a net list.

3. A method for testing a printed circuit as claimed in claim 1, further comprising repeating said positioning, said axially moving and said testing from point to point for n test points, so that n–1 tests are performed.

4. A method for testing a printed circuit as claimed in claim 1, further comprising selecting a test point from each of a pair of nets, wherein said testing comprises testing the test points of the pair of nets by using an analysis device to analyze whether a short circuit exists between the test points.

5. A machine for testing a printed circuit as claimed in claim 4, wherein both of said two needle bearing boards are movable along their planes in both their orthogonal axes in order to properly position said two needle bearing boards over the test points on the printed circuit.

6. A method for testing a printed circuit as claimed in claim 1, further comprising repeating said positioning, said axially moving and said testing for n nets, so that n*(n−1)/2 tests are performed.

7. A method for testing a printed circuit as claimed in claim 1, further comprising repeating said positioning, said axially moving and said testing for a number of nets that are located within a predetermined distance from each other.

8. A method for testing a printed circuit as claimed in claim 1, further comprising:
   subdividing all test points located on each side of the printed circuit into a number of sectors corresponding to a number of needles located on a respective one of the needle bearing boards such that each of the test points is reachable by a needle on the respective one of the needle bearing boards; and
   repeating said positioning, said axially moving and said testing for all test points, wherein said testing comprises testing the test points of the printed circuit by using an analysis device to analyze connection or insulation between the test points.

9. A method for testing a printed circuit as claimed in claim 1, wherein said positioning comprises independently positioning the two needle bearing boards along their planes in both their orthogonal axes with respect to the printed circuit to positions such that one needle of each of the plurality of independently operable conductive needles of each of the two needle bearing boards is in position to contact a test point on the printed circuit.

10. A method for testing a printed circuit as claimed in claim 1, further comprising repeating said positioning, said axially moving and said testing for all of the test points, wherein:
   said placing further comprises:
      placing the printed circuit on a bearing frame for transporting to a position between the two needle bearing boards, and
      fixing the circuit board in the position; and
   said testing comprises testing the test points of the printed circuit by using an analysis device to analyze continuity and short circuits between the test points.

11. A machine for testing a printed circuit, said machine comprising:
   an analysis device operable to analyze electric parameters of the printed circuits;
   two needle bearing boards opposing each other such that the printed circuit can be placed in between, wherein at least one of said two needle bearing boards is movable along its plane in both its orthogonal axes in order to properly position said at least one of said two needle bearing boards over a test point on the printed circuit and said at least one of said two needle bearing boards requires a movement in each of the orthogonal axes of no greater than a distance between two of said plurality of conductive needles on said at least one of said needle bearing boards;
   a bearing plane operable to transport the printed circuit between said two needle bearing boards;
   a plurality of conductive needles located on each of said two needle bearing boards and connected to said analysis device, wherein each of said plurality of conductive needles is independently operable to interact with the printed circuit and said at least one of said two needle bearing boards requires a movement in each of the orthogonal axes of no greater than a distance between two of said plurality of conductive needles on said at least one of said two needle bearing boards;
   electromagnets operable to make each of said plurality of conductive needles independently axially moveable with respect to said two needle bearing boards; and
   a computer operable to control said electromagnets such that only one of said plurality of conductive needles on each of said two needle bearing boards contacts a test point of the printed circuit.

* * * * *